(12) United States Patent
Anderson et al.

(10) Patent No.: US 11,600,565 B2
(45) Date of Patent: Mar. 7, 2023

(54) TOP VIA STACK

(71) Applicant: International Business Machines Corporation, Armonk, NY (US)

(72) Inventors: Brent Alan Anderson, Jericho, VT (US); Lawrence A. Clevenger, Saratoga Springs, NY (US); Christopher J. Penny, Saratoga Springs, NY (US); Kisik Choi, Watervliet, NY (US); Nicholas Anthony Lanzillo, Wynantskill, NY (US); Robert Robison, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 17/496,252

(22) Filed: Oct. 7, 2021

(65) Prior Publication Data

US 2022/0028783 A1    Jan. 27, 2022

Related U.S. Application Data

(62) Division of application No. 16/739,556, filed on Jan. 10, 2020, now Pat. No. 11,195,792.

(51) Int. Cl.
*H01L 21/00* (2006.01)
*H01L 23/522* (2006.01)
*H01L 23/528* (2006.01)
*H01L 23/532* (2006.01)

(52) U.S. Cl.
CPC ........ *H01L 23/5226* (2013.01); *H01L 23/528* (2013.01); *H01L 23/53214* (2013.01); *H01L 23/53257* (2013.01)

(58) Field of Classification Search
CPC ............... H01L 23/5226; H01L 23/528; H01L 23/53214
See application file for complete search history.

(56) References Cited

U.S. PATENT DOCUMENTS 5,512,514 A    4/1996 Lee
5,693,568 A    12/1997 Liu et al.
(Continued)

OTHER PUBLICATIONS

List of IBM Patents or Patent Applications Treated as Related.

*Primary Examiner* — Laura M Menz
(74) *Attorney, Agent, or Firm* — Daniel Yeates; Ryan, Mason & Lewis, LLP

(57) ABSTRACT

A semiconductor structure includes a first metallization layer disposed on a first etch stop layer. The first metallization layer includes a first conductive line and a second conductive line, each disposed in a first dielectric layer and extending from the first etch stop layer. The height of the first conductive line is greater than a height of the second conductive line. The semiconductor structure further includes a first via layer comprising a second dielectric layer disposed on a top surface of the first metallization layer and a first via and a second via in the second dielectric layer. The semiconductor structure further includes a first conductive material disposed on a top surface of the first conductive line in the first via. The semiconductor structure further includes a second conductive material disposed on a top surface of the second conductive line in the second via.

20 Claims, 4 Drawing Sheets

(56) References Cited

U.S. PATENT DOCUMENTS

| | | | | |
|---|---|---|---|---|
| 5,759,911 | A * | 6/1998 | Cronin | H01L 21/31144 |
| | | | | 438/629 |
| 5,821,169 | A * | 10/1998 | Nguyen | H01L 21/76811 |
| | | | | 438/738 |
| 6,815,820 | B2 | 11/2004 | Yu et al. | |
| 7,309,654 | B2 * | 12/2007 | Schaller | H01L 21/31144 |
| | | | | 257/E21.252 |
| 7,592,258 | B2 * | 9/2009 | Lehr | H01L 21/76835 |
| | | | | 257/E21.585 |
| 7,847,409 | B2 * | 12/2010 | Gambino | H01L 21/02164 |
| | | | | 257/774 |
| 8,227,339 | B2 * | 7/2012 | Ponoth | H01L 21/76816 |
| | | | | 257/E21.548 |
| 8,236,663 | B2 * | 8/2012 | Coolbaugh | H01L 21/76832 |
| | | | | 438/381 |
| 8,703,604 | B2 * | 4/2014 | Ponoth | H01L 23/5226 |
| | | | | 257/E21.548 |
| 8,753,950 | B2 * | 6/2014 | Coolbaugh | H01L 23/481 |
| | | | | 438/585 |
| 8,907,458 | B2 * | 12/2014 | Ponoth | H01L 23/53295 |
| | | | | 257/E21.585 |
| 8,912,093 | B2 * | 12/2014 | Wang | H01L 21/76 |
| | | | | 438/638 |
| 9,171,778 | B2 * | 10/2015 | Coolbaugh | H01L 23/5223 |
| 9,536,830 | B2 | 1/2017 | Bao et al. | |
| 9,613,861 | B2 | 4/2017 | Anderson et al. | |
| 9,659,864 | B2 | 5/2017 | Wu et al. | |
| 10,032,643 | B2 | 7/2018 | Chawla et al. | |
| 10,243,020 | B1 | 3/2019 | Clevenger | G11C 11/161 |
| 10,622,407 | B1 * | 4/2020 | Huang | H01L 43/02 |
| 10,748,901 | B2 * | 8/2020 | Rubin | H01L 27/092 |
| 10,770,511 | B2 * | 9/2020 | Clevenger | H01L 27/228 |
| 10,903,161 | B2 * | 1/2021 | Patlolla | H01L 21/76877 |
| 10,910,307 | B2 * | 2/2021 | Patlolla | H01L 23/528 |
| 11,139,201 | B2 * | 10/2021 | Motoyama | H01L 23/53257 |
| 11,171,084 | B2 * | 11/2021 | Anderson | H01L 21/76877 |
| 11,189,568 | B2 * | 11/2021 | Anderson | H01L 23/5283 |
| 11,195,792 | B2 * | 12/2021 | Anderson | H01L 23/53257 |
| 11,276,637 | B2 * | 3/2022 | Wang | H01L 21/76844 |
| 2002/0135043 | A1 * | 9/2002 | McDevitt | H01L 23/5258 |
| | | | | 257/E23.15 |
| 2006/0180930 | A1 * | 8/2006 | Nguyen | H01L 23/5226 |
| | | | | 257/E23.152 |
| 2007/0161290 | A1 * | 7/2007 | Fitzsimmons | H01L 21/76825 |
| | | | | 439/607.01 |
| 2010/0009509 | A1 * | 1/2010 | Coolbaugh | H01L 21/76832 |
| | | | | 438/381 |
| 2011/0101538 | A1 * | 5/2011 | Ponoth | H01L 21/768 |
| | | | | 257/E21.585 |
| 2012/0068346 | A1 * | 3/2012 | Ponoth | H01L 23/53266 |
| | | | | 257/773 |
| 2012/0153503 | A1 * | 6/2012 | Ponoth | H01L 21/76829 |
| | | | | 257/E23.145 |
| 2012/0171859 | A1 * | 7/2012 | Ponoth | H01L 23/5226 |
| | | | | 257/E21.586 |
| 2012/0190164 | A1 * | 7/2012 | Coolbaugh | H01L 23/5223 |
| | | | | 438/381 |
| 2012/0273848 | A1 * | 11/2012 | Fan | H01L 21/76897 |
| | | | | 257/E21.409 |
| 2014/0151899 | A1 * | 6/2014 | Coolbaugh | H01L 23/5223 |
| | | | | 257/774 |
| 2015/0056800 | A1 | 2/2015 | Mebarki et al. | |
| 2019/0165042 | A1 * | 5/2019 | Clevenger | H01L 43/12 |
| 2019/0206781 | A1 | 7/2019 | Aleksov et al. | |
| 2019/0385923 | A1 * | 12/2019 | Van Der Wiel | H01L 29/402 |
| 2020/0126987 | A1 * | 4/2020 | Rubin | H01L 29/0847 |
| 2020/0144178 | A1 * | 5/2020 | Patlolla | H01L 23/53242 |
| 2020/0144180 | A1 * | 5/2020 | Patlolla | H01L 23/53209 |
| 2021/0066126 | A1 * | 3/2021 | Ramanathan | H01L 27/2436 |
| 2021/0118722 | A1 * | 4/2021 | Cheng | H01L 23/53214 |
| 2021/0134664 | A1 * | 5/2021 | Motoyama | H01L 23/53257 |
| 2021/0217696 | A1 * | 7/2021 | Anderson | H01L 21/76883 |
| 2021/0249302 | A1 * | 8/2021 | Anderson | H01L 21/76805 |
| 2021/0287988 | A1 * | 9/2021 | Xie | H01L 21/76852 |
| 2021/0313265 | A1 * | 10/2021 | Anderson | H01L 21/7688 |
| 2021/0343643 | A1 * | 11/2021 | Anderson | H01L 21/76816 |
| 2022/0005761 | A1 * | 1/2022 | Anderson | H01L 21/7688 |
| 2022/0028783 | A1 * | 1/2022 | Anderson | H01L 21/76883 |
| 2022/0028785 | A1 * | 1/2022 | Anderson | H01L 21/76829 |

* cited by examiner

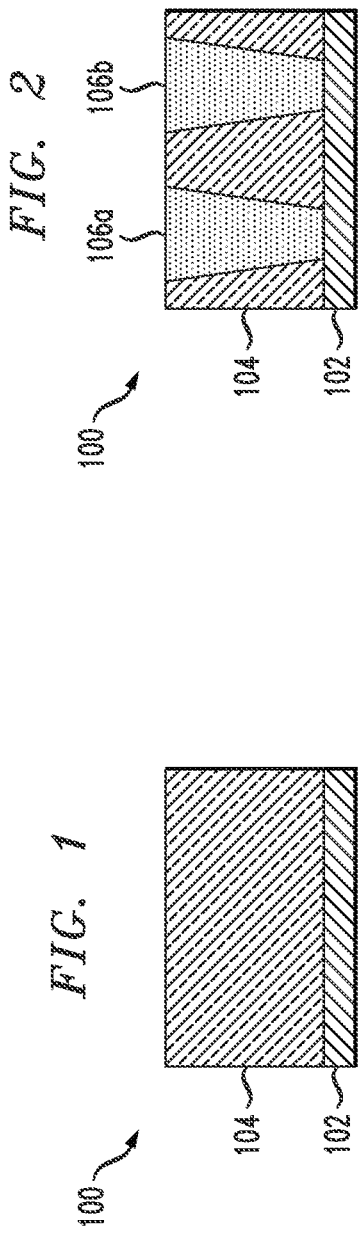
FIG. 1
FIG. 2
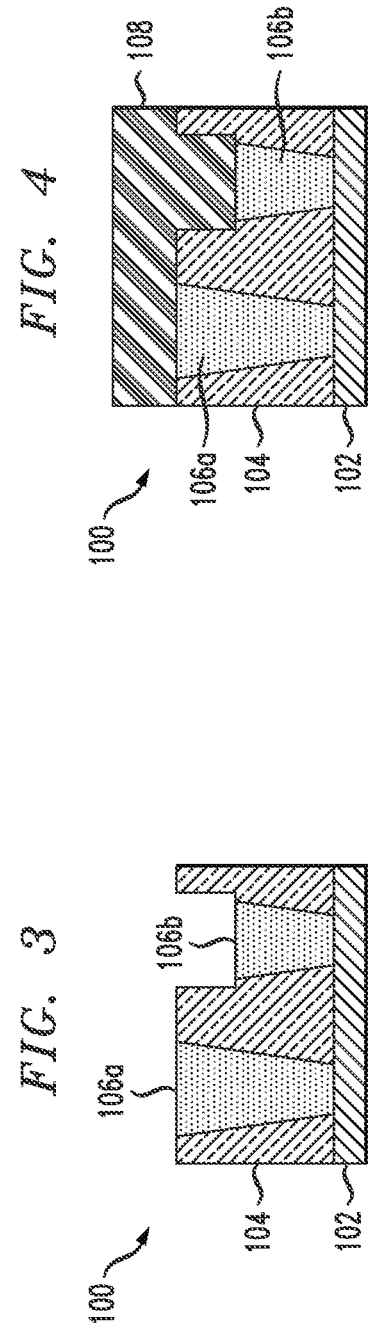
FIG. 3
FIG. 4

TOP VIA STACK

BACKGROUND

With the current trends in IC miniaturization, and increasingly smaller critical dimensions, it is desirable in semiconductor device technology to integrate many different functions on a single chip. In the IC chip fabrication industry, there are three sections referred to in a typical IC chip build: front-end-of-line (FEOL), back-end-of-line (BEOL) and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. The FEOL transistor devices are typically processed using single crystal and poly-crystalline silicon. The BEOL interconnects are typically made of multiple metals; the bulk of the conductor is copper. If copper diffuses into the FEOL silicon-based devices, it can cause shorting or alter sensitive transistor characteristics and render the semiconductor useless. This is the reason for the MOL connection.

SUMMARY

Illustrative embodiments of the present application include techniques for use in semiconductor manufacture. In one illustrative embodiment, a method comprises forming a first metallization layer on a first etch stop layer comprising a first conductive line and a second conductive line in a first dielectric layer. The method further comprises selectively recessing a portion of the second conductive line. The height of the first conductive line is greater than the height of the second conductive line. The method further comprises depositing a second dielectric layer in the recessed portion of the second conductive line and on a top surface of the first conductive line. The method further comprises forming a first via layer comprising a first via in the second dielectric layer and exposing a top surface of the second conductive line. The method further comprises depositing a first conductive material in the first via.

In another illustrative embodiment, a method comprises forming a first metallization layer on a first etch stop layer comprising a first conductive line and a second conductive line in a portion of a first dielectric layer. The method further comprises selectively recessing a portion of the second conductive line. The height of the first conductive line is greater than the height of the second conductive line. The method further comprises depositing a second dielectric layer in the recessed portion of the second conductive line and on a top surface of the first conductive line. The method further comprises forming a first via layer comprising a first via in the second dielectric layer and exposing a top surface of the first conductive line and a second via in the second dielectric layer and exposing a top surface of the second conductive line. The method further comprises depositing a first conductive material in the first via and the second via.

In another illustrative embodiment, a semiconductor structure comprises a first metallization layer disposed on a first etch stop layer. The first metallization layer comprises a first conductive line and a second conductive line disposed in a first dielectric layer. The height of the first conductive line is greater than a height of the second conductive line. The semiconductor structure further comprises a first via layer comprising a second dielectric layer disposed on a top surface of the first metallization layer and a first via in the second dielectric layer. The first via is configured to expose a portion of a top surface of the second conductive line. The semiconductor structure further comprises a first conductive material disposed in the first via of the first via layer.

In another illustrative embodiment, a semiconductor structure comprises a first metallization layer disposed on a first etch stop layer. The first metallization layer comprises a first conductive line and a second conductive line disposed in a first dielectric layer. The height of the first conductive line is greater than a height of the second conductive line. The semiconductor structure further comprises a first via layer comprising a second dielectric layer disposed on a top surface of the first metallization layer and a first via and a second via in the second dielectric layer. The first via is configured to expose a portion of a top surface of the first conductive line, and the second via is configured to expose a portion of a top surface of the second conductive line. The semiconductor structure further comprises a first conductive material disposed in the first via and a second conductive material disposed in the second via.

Other embodiments will be described in the following detailed description of embodiments, which is to be read in conjunction with the accompanying figures.

BRIEF DESCRIPTION OF THE DRAWINGS

FIG. 1 is a schematic cross-sectional side view of a semiconductor structure at a first-intermediate stage of fabrication, according to one or more illustrative embodiments.

FIG. 2 is a schematic cross-sectional side view of the semiconductor structure at a second-intermediate stage of fabrication, according to one or more illustrative embodiments.

FIG. 3 is a schematic cross-sectional side view of the semiconductor structure at a third-intermediate stage of fabrication, according to one or more illustrative embodiments.

FIG. 4 is a schematic cross-sectional side view of the semiconductor structure at a fourth-intermediate stage of fabrication, according to one or more illustrative embodiments.

DETAILED DESCRIPTION

Figure 5:
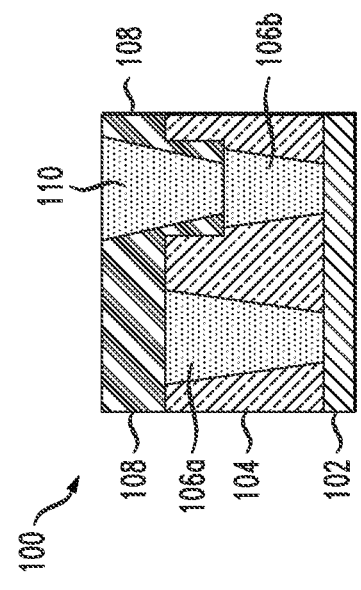
FIG. 5 is a schematic cross-sectional side view of the semiconductor structure at a fifth-intermediate stage of fabrication, according to one or more illustrative embodiments.

This disclosure relates generally to integrated circuits (IC), and more particularly to semiconductor ICs, and methods for their construction.

Exemplary embodiments of the invention will now be discussed in further detail with regard to integrated circuits and a method of manufacturing the IC, and more particularly to top via interconnects having variable metal line heights within a given metallization level. High interconnect line resistance is a major limiting factor in achieving favorable device performance in advanced technology nodes. Thus, embodiments described herein provide an integration scheme which allows for variable line heights within a given metallization level. Accordingly, metal lines can be made selectively taller, which significantly decreases resistance.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for fabricating metallic interconnects will be described below with reference to FIGS. 1-15. Note that the same reference numeral (100) is used to denote the semiconductor structure through the various intermediate fabrication stages illustrated in FIGS. 1 through 15. Note also that the semiconductor structure described herein can also be considered to be a semiconductor device and/or an integrated circuit, or some part thereof. For the purpose of clarity, some fabrication steps leading up to the production of the metallic interconnects as illustrated in FIGS. 1-15 are omitted. In other words, one or more well-known processing steps which are not illustrated but are well-known to those of ordinary skill in the art have not been included in the figures.

FIGS. 1-9 illustrate an embodiment for fabricating metallic interconnects. To begin, FIG. 1 is a schematic cross-sectional side view of a semiconductor structure 100 at a first-intermediate stage of fabrication comprising an etch stop layer 102 and a dielectric layer 104. In general, the etch stop layer 102 is formed on a semiconductor substrate (not shown) which may comprise one of different types of semiconductor substrate structures and materials. For example, in one embodiment, a semiconductor substrate can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of an FEOL.

Suitable material for etch stop layer 102 includes, by way of example, any appropriate material, such as silicon nitride, silicon carbide, nitrogen-enriched silicon carbide, a combination of any of these materials, and the like. Etch stop layer 102 can be deposited on the semiconductor substrate by conventional techniques such as atomic layer deposition (ALD), chemical vapor deposition (CVD), physical vapor deposition (PVD) or spin on deposition, followed by a standard planarization process (e.g., CMP) to planarize the upper surfaces. In one embodiment, etch stop layer 102 can have a thickness ranging from about 0.5 to about 10 nm.

Dielectric layer 104 is deposited on etch stop layer 102. Dielectric layer 104 may be made of any known dielectric material such as, for example, silicon oxide, silicon nitride, hydrogenated silicon carbon oxide, silicon based low-k dielectrics, flowable oxides, porous dielectrics, or organic dielectrics including porous organic dielectrics. In one illustrative embodiment, the dielectric layer 104 may be comprised of a low-k dielectric material having a permittivity of 3.0 or significantly less, such as approximately 2.8 or less. Non-limiting examples of suitable low-k dielectric materials include a spin-on-glass, a flowable oxide, a high density plasma oxide, borophosphosilicate glass (BPSG), or any combination thereof. The dielectric layer 104 may be formed by any suitable deposition technique known in the art, including ALD, CVD, PVD, molecular beam deposition (MBD), pulsed laser deposition (PLD), or liquid source misted chemical deposition (LSMCD). In one embodiment, dielectric layer 104 can have a thickness ranging from about 10 to about 100 nm.

FIG. 2 illustrates the semiconductor structure 100 at a second intermediate stage of fabrication. During this stage, trenches (not shown) are formed using a standard lithography material (not shown) as a guide. The etch may, for example, comprise a reactive ion etch (ME) as known to those skilled in the art. The trenches are extended through dielectric layer 104, exposing a top surface of etch stop layer 102. The standard lithography material can be completely removed during the etching process.

Next, a first metallization layer (or level MD is formed by depositing a conductive material in the trenches to form metal lines 106a and 106b. The conductive material can be deposited by a suitable deposition process such as, for example CVD, ALD, PVD, plasma enhanced chemical vapor deposition (PECVD), chemical solution deposition or other like processes. Suitable conductive metals for metal lines 106a and 106b are any conductive material that can be dry or wet etched or patterned including, for example, aluminum (Al), chromium (Cr), hafnium (Hf), iridium (Ir), molybdenum (Mo), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof. In one embodiment, the first metallization layer is formed by one or more of Al, Ru, Ta, Ti or W. Subsequently, any metal overburden is then planarized by, for example, a planarization process such as a chemical mechanical planarization (CMP) process FIG. 3 illustrates the semiconductor structure 100 at a third intermediate stage of fabrication. During this stage, a top portion of metal line 106b is recessed by wet chemistry, e.g., a wet chemistry using alanine carrying out an isotropic etching technique such as an atomic layer etching.

FIG. 4 illustrates the semiconductor structure 100 at a fourth intermediate stage of fabrication. During this stage, dielectric layer 108 is deposited in the recessed portion of metal line 106b and on the top surface of dielectric layer 104 and metal line 106a using a suitable deposition process, for example CVD, ALD, PVD, PECVD, or other like processes. Suitable material for dielectric layer 108 can be any of those discussed above for dielectric layer 104. In general, dielectric layer 108 can have a thickness of about 5 to about 50 from the top surface of dielectric layer 104 and trench 106a.

FIG. 5 illustrates the semiconductor structure 100 at a fifth intermediate stage of fabrication. During this stage, a first via layer (or level V1) is formed by selectively etching via 110 in dielectric layer 108 to expose a portion of a top surface of metal line 106b. The via 110 can be formed by a directional etching such as ME. Next, a conductive material is deposited in the via 110. The conductive material can be any of those described above for filling metal lines 106a and 106b. In one embodiment, the conductive material is one or more of Al, Ru, Ta, Ti or W.

Figure 6:
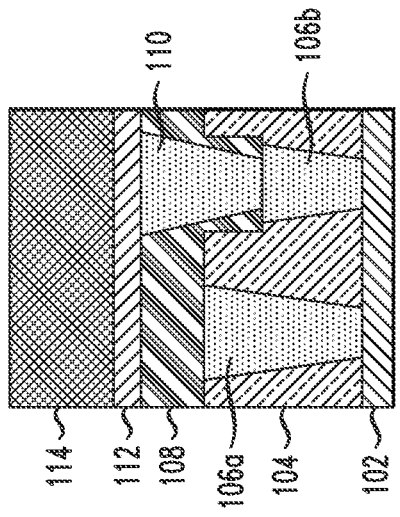
FIG. 6 is a schematic cross-sectional side view of the semiconductor structure at a sixth-intermediate stage of fabrication, according to one or more illustrative embodiments.

FIG. 6 illustrates the semiconductor structure 100 at a sixth intermediate stage of fabrication. During this stage, an etch stop layer 112 is formed on a top surface of dielectric layer 108 and via 110. Suitable material for etch stop layer 112 can be any of those discussed above for etch stop layer 102. Etch stop layer 112 can be deposited by conventional techniques such as ALD, CVD, PVD or spin on deposition, followed by a standard planarization process (e.g., CMP) to planarize the upper surfaces. In one embodiment, etch stop layer 112 can have a thickness ranging from about 0.5 to about 10 nm.

Next, dielectric layer 114 is deposited on etch stop layer 112. Dielectric layer 114 may be made of any known dielectric material as discussed above for dielectric layer 104. The dielectric layer 114 may be formed by any suitable deposition technique known in the art, including ALD, CVD, PVD, MBD, PLD, or LSMCD. In one embodiment, dielectric layer 114 can have a thickness ranging from about 10 to about 100 nanometers (nm).

Figure 7:
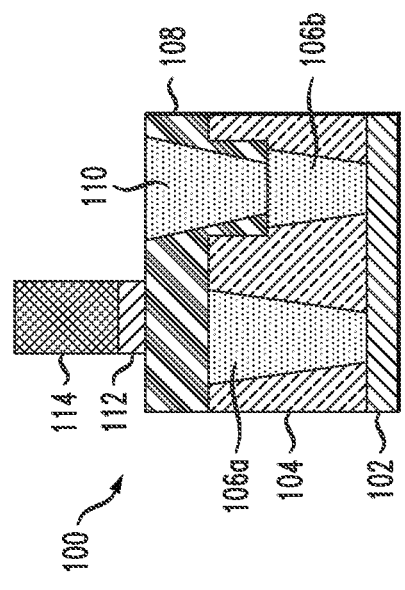
FIG. 7 is a schematic cross-sectional side view of the semiconductor structure at a seventh-intermediate stage of fabrication, according to one or more illustrative embodiments.

FIG. 7 illustrates the semiconductor structure 100 at a seventh intermediate stage of fabrication. During this stage, a portion of etch stop layer 112 and dielectric layer 114 are removed by, for example, a dry or wet etch process to expose a top surface of dielectric layer 108 and the conductive material in via 110.

Figure 8:
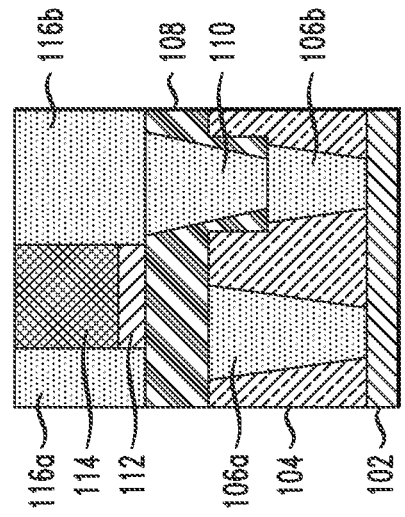
FIG. 8 is a schematic cross-sectional side view of the semiconductor structure at an eighth-intermediate stage of fabrication, according to one or more illustrative embodiments.

FIG. 8 illustrates the semiconductor structure 100 at an eighth intermediate stage of fabrication. During this stage, a second metallization layer (or level M2) is formed by depositing a conductive material on opposite sides of the remaining etch stop layer 112 and dielectric layer 114 and on the top surface of dielectric layer 108 and in via 110 to form metal lines 116a and 116b. The conductive material can be deposited by conventional techniques such as ALD, CVD, PVD or spin on deposition, followed by a standard planarization process (e.g., CMP) to planarize the upper surfaces.

The conductive material can be any of those discussed above for metal lines 106a and 106b.

Figure 9:
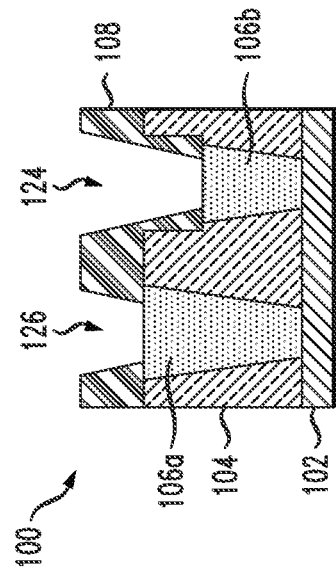
FIG. 9 is a schematic cross-sectional side view of the semiconductor structure at a ninth-intermediate stage of fabrication, according to one or more illustrative embodiments.

FIG. 9 illustrates the semiconductor structure 100 at a ninth intermediate stage of fabrication. During this stage, a second via layer (or level V2) is formed by first depositing a dielectric layer 118 on a top surface of dielectric layer 114 and metal lines 116a and 116b using a suitable deposition process, for example CVD, ALD, PVD, PECVD, or other like processes. Suitable material for dielectric layer 118 can be any of those discussed above for dielectric layer 104. In general, dielectric layer 118 can have a thickness of about 5 to about 50.

Next, first and second vias 120 and 122 are formed by selectively etching the vias in dielectric layer 118 to expose the top surface of metal lines 116a and 116b. Each via can be formed by a directional etching such as RIE. Next, a conductive material is deposited in first and second vias 120 and 122 using a suitable deposition process, for example CVD, ALD, PVD, PECVD, or other like processes. The conductive material can be any of those described above for metal lines 106a and 106b. In one embodiment, the conductive material is one or more of Al, Ru, Ta, Ti or W.

Figure 10:
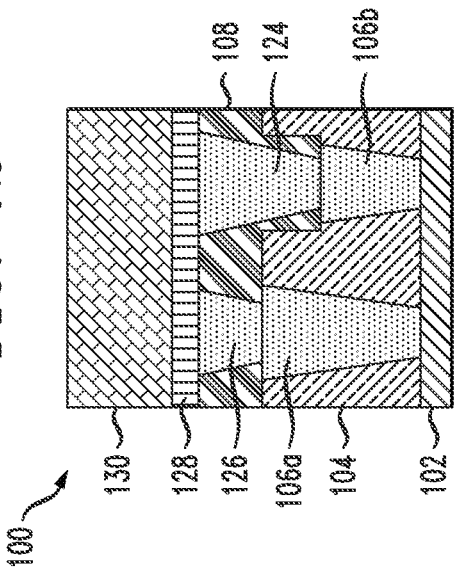
FIG. 10 is a schematic cross-sectional side view of the semiconductor structure at a first-intermediate stage of fabrication starting from the semiconductor structure of FIG. 4, according to one or more alternative illustrative embodiments.

FIGS. 10-15 illustrate an alternate embodiment starting with the semiconductor structure 100 of FIG. 4. FIG. 10 illustrates the semiconductor structure 100 at a first intermediate stage of fabrication. During this stage, a first via layer (or level V1) is formed on the first metallization layer by selectively etching first and second vias 124 and 126 in dielectric layer 108 to expose a portion of a top surface of each of metal lines 106a and 106b. The first and second vias 124 and 126 can be formed by a directional etching such as ME. As can be seen, the length of via 124 is greater than the length of via 126.

Figure 11:
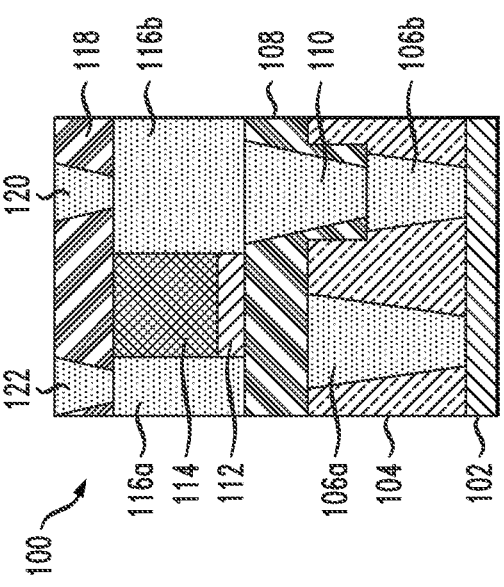
FIG. 11 is a schematic cross-sectional side view of the semiconductor structure at a second-intermediate stage of fabrication, according to one or more alternative illustrative embodiments.

FIG. 11 illustrates the semiconductor structure 100 at a second intermediate stage of fabrication. During this stage, a conductive material is deposited in first and second vias 124 and 126 using a suitable deposition process, for example CVD, ALD, PVD, PECVD, or other like processes. The conductive material can be any of those described above for metal lines 106a and 106b. In one embodiment, the conductive material is one or more of Al, Ru, Ta, Ti or W.

Figure 12:
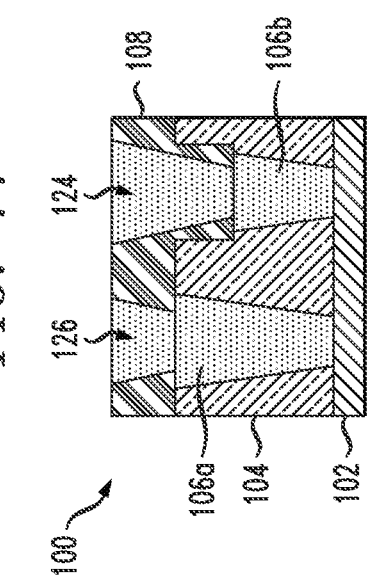
FIG. 12 is a schematic cross-sectional side view of the semiconductor structure at a third-intermediate stage of fabrication, according to one or more alternative illustrative embodiments.

FIG. 12 illustrates the semiconductor structure 100 at a third intermediate stage of fabrication. During this stage, etch stop layer 128 is formed on a top surface of dielectric layer 108 and first and second vias 124 and 126. Suitable material for etch stop layer 128 can be any of those discussed above for etch stop layer 102. Etch stop layer 128 may be formed by conventional techniques such as ALD, CVD, PVD or spin on deposition, followed by a standard planarization process (e.g., CMP) to planarize the upper surfaces. In one embodiment, etch stop layer 128 can have a thickness ranging from about 0.5 to about 10 nm.

Next, dielectric layer 130 is formed on etch stop layer 128. Dielectric layer 130 may be made of any known dielectric material as discussed above for dielectric layer 104. The dielectric layer 130 may be formed by any suitable deposition technique known in the art, including ALD, CVD, PVD, MBD, PLD, or LSMCD. In one embodiment, dielectric layer 130 can have a thickness ranging from about 10 to about 100 nm.

Figure 13:
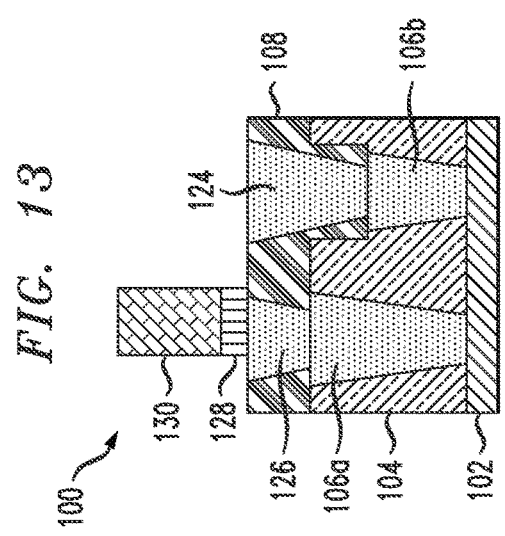
FIG. 13 is a schematic cross-sectional side view of the semiconductor structure at a fourth-intermediate stage of fabrication, according to one or more alternative illustrative embodiments.

FIG. 13 illustrates the semiconductor structure 100 at a fourth intermediate stage of fabrication. During this stage, a portion of etch stop layer 128 and dielectric layer 130 are removed by, for example, a dry or wet etch process to expose a top surface of dielectric layer 108 and the conductive material in via 126, and a portion of the top surface of the conductive material in via 124.

Figure 14:
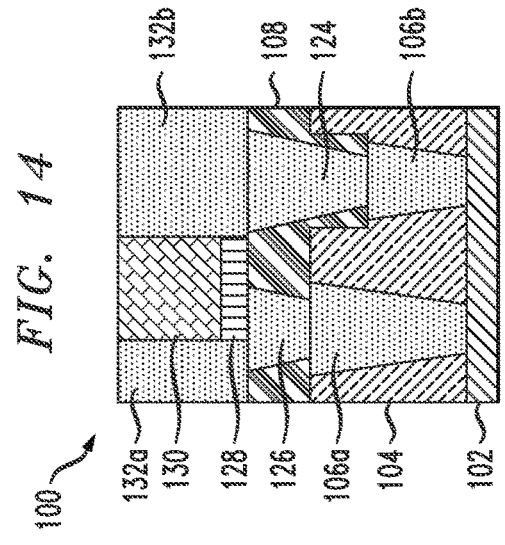
FIG. 14 is a schematic cross-sectional side view of the semiconductor structure at a fifth-intermediate stage of fabrication, according to one or more alternative illustrative embodiments.

FIG. 14 illustrates the semiconductor structure 100 at a fifth intermediate stage of fabrication. During this stage, a second metallization layer (or level M2) is formed by depositing a conductive material on opposite sides of the remaining etch stop layer 128 and dielectric layer 130 and on the top surface of dielectric layer 108 and the conductive material in via 126 to form metal lines 132a and 132b. The conductive material can be deposited by conventional techniques such as ALD, CVD, PVD or spin on deposition, followed by a standard planarization process (e.g., CMP) to planarize the upper surfaces. The conductive material can be any of those discussed above for metal lines 106a and 106b.

Figure 15:
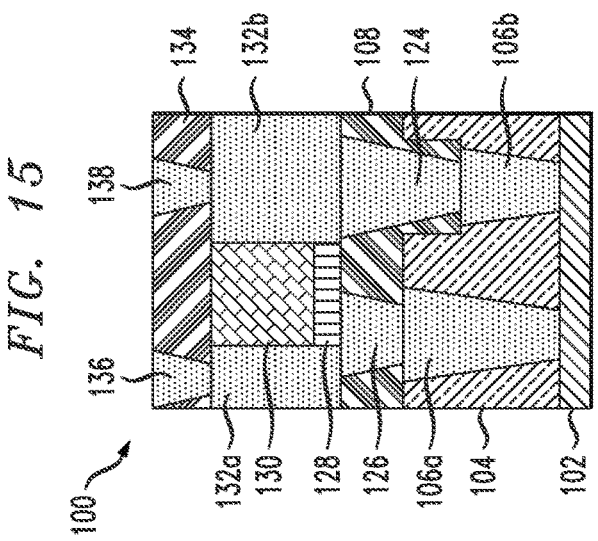
FIG. 15 is a schematic cross-sectional side view of the semiconductor structure at a sixth-intermediate stage of fabrication, according to one or more alternative illustrative embodiments.

FIG. 15 illustrates the semiconductor structure 100 at a sixth intermediate stage of fabrication. During this stage, a second via layer (or level V2) is formed by first depositing a dielectric layer 134 on a top surface of dielectric layer 130 and metal lines 132a and 132b using a suitable deposition process such as, for example CVD, ALD, PVD, PECVD, or other like processes. Suitable material for dielectric layer 134 can be any of those discussed above for dielectric layer 104. In general, dielectric layer 134 can have a thickness of about 5 to about 50.

Next, vias 136 and 138 are formed by selectively etching the vias in dielectric layer 130 to expose a portion of the top surface of metal lines 132a and 132b. Each via can be formed by a directional etching such as RIE. Next, a conductive material is deposited in vias 136 and 138 using a suitable deposition process, for example CVD, ALD, PVD, PECVD, or other like processes. The conductive material can be any of those described above for metal lines 106a and 106b. In one embodiment, the conductive material is one or more of Al, Ru, Ta, Ti or W.

It is to be understood that the methods discussed herein for fabricating low-resistivity metallic interconnect structures (e.g., copper BEOL interconnect structures) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor structure, comprising:
  a first metallization layer disposed on a first etch stop layer, wherein the first metallization layer comprises a first conductive line and a second conductive line, each disposed in a first dielectric layer and extending from the first etch stop layer, wherein a height of the first conductive line is greater than a height of the second conductive line;

a first via layer comprising a second dielectric layer disposed on a top surface of the first metallization layer and a first via and a second via in the second dielectric layer;

a first conductive material disposed on a top surface of the first conductive line in the first via; and a second conductive material disposed on a top surface of the second conductive line in the second via.

2. The semiconductor structure of claim 1, further comprising:

a second etch stop layer disposed on a portion of a top surface of the second dielectric layer and the first conductive material; and a third dielectric layer disposed on the second etch stop layer.

3. The semiconductor structure of claim 2, further comprising:

a second metallization layer disposed on the first via layer, wherein the second metallization layer comprises a first conductive line disposed on the top surface of the second dielectric layer and the first conductive material and in contact with sidewalls of the third dielectric layer and the second etch stop layer; and a second conductive line disposed on the top surface of the second dielectric layer and the second conductive material and in contact with sidewalls of the third dielectric layer and the second etch stop layer.

4. The semiconductor structure of claim 3, further comprising:

a second via layer comprising a fourth dielectric layer disposed on a top surface of the second metallization layer and a first via and a second via in the fourth dielectric layer; and a third conductive material disposed in the first via and the second via in the second via layer.

5. The semiconductor structure of claim 3, wherein a width of the first conductive line of the second metallization layer is greater than a width of the second conductive line of the second metallization layer.

6. The semiconductor structure of claim 4, wherein the first via and the second via of the second via layer have the same height.

7. The semiconductor structure of claim 1, wherein the first etch stop layer is disposed on a semiconductor substrate.

8. The semiconductor structure of claim 1, wherein the first dielectric layer comprises a low-k dielectric material.

9. The semiconductor structure of claim 4, wherein the first conductive material, the second conductive material and the third conductive material are independently selected from the group consisting of aluminum, chromium, hafnium, iridium, molybdenum, niobium, osmium, rhenium, rhodium, ruthenium, tantalum, titanium, tungsten, vanadium, zirconium, and alloys thereof.

10. The semiconductor structure of claim 1, wherein a top surface of the first conductive material and a top surface of the second conductive material are coplanar.

11. An integrated circuit, comprising:

one or more semiconductor structures, wherein at least one of the one or more semiconductor structures comprises:

a first metallization layer disposed on a first etch stop layer, wherein the first metallization layer comprises a first conductive line and a second conductive line, each disposed in a first dielectric layer and extending from the first etch stop layer, wherein a height of the first conductive line is greater than a height of the second conductive line;

a first via layer comprising a second dielectric layer disposed on a top surface of the first metallization layer and a first via and a second via in the second dielectric layer;

a first conductive material disposed on a top surface of the first conductive line in the first via; and a second conductive material disposed on a top surface of the second conductive line in the second via.

12. The integrated circuit of claim 11, further comprising:

a second etch stop layer disposed on a portion of a top surface of the second dielectric layer and the first conductive material; and a third dielectric layer disposed on the second etch stop layer.

13. The integrated circuit of claim 12, further comprising:

a second metallization layer disposed on the first via layer, wherein the second metallization layer comprises a first conductive line disposed on the top surface of the second dielectric layer and the first conductive material and in contact with sidewalls of the third dielectric layer and the second etch stop layer; and a second conductive line disposed on the top surface of the second dielectric layer and the second conductive material and in contact with sidewalls of the third dielectric layer and the second etch stop layer.

14. The integrated circuit of claim 13, further comprising:

a second via layer comprising a fourth dielectric layer disposed on a top surface of the second metallization layer and a first via and a second via in the fourth dielectric layer; and a third conductive material disposed in the first via and the second via in the second via layer.

15. The integrated circuit of claim 13, wherein a width of the first conductive line of the second metallization layer is greater than a width of the second conductive line of the second metallization layer.

16. The integrated circuit of claim 14, wherein the first via and the second via of the second via layer have the same height.

17. The integrated circuit of claim 11, wherein a top surface of the first conductive material and a top surface of the second conductive material are coplanar.

18. A method, comprising:

forming a first metallization layer on a first etch stop layer comprising a first conductive line and a second conductive line in a first dielectric layer;

selectively recessing a portion of the second conductive line, wherein a height of the first conductive line is greater than a height of the second conductive line;

depositing a second dielectric layer in the recessed portion of the second conductive line and on a top surface of the first conductive line;

forming a first via layer comprising a first via in the second dielectric layer and exposing a top surface of the second conductive line; and depositing a first conductive material in the first via.

19. The method of claim 18, further comprising:

depositing a second etch stop layer on a top surface of the second dielectric layer and the first conductive material; and depositing a third dielectric layer on the second etch stop layer.

20. The method of claim 19, further comprising:
  removing a portion of the third dielectric layer and the second etch stop layer and exposing the top surface of the second dielectric layer and the first conductive material.

\* \* \* \* \*